(12) United States Patent
Hou et al.

(10) Patent No.: US 8,441,794 B2
(45) Date of Patent: May 14, 2013

(54) LIQUID COOLER AND METHOD OF ITS MANUFACTURE

(75) Inventors: Jin Hou, Norrköping (SE); Henrik Nyström, Svaärtinge (SE); Seppo Tuovinen, Finspång (SE); David Littler, Shanghai (CN); Yamin Wang, Shanghai (CN)

(73) Assignee: SAPA Profiles (Shanghai) Ltd., Shanghai (CN)

( * ) Notice: Subject to any disclaimer, the term of this patent is extended or adjusted under 35 U.S.C. 154(b) by 31 days.

(21) Appl. No.: 13/000,176

(22) PCT Filed: Jun. 16, 2009

(86) PCT No.: PCT/SE2009/050748
§ 371 (c)(1),
(2), (4) Date: Mar. 28, 2011

(87) PCT Pub. No.: WO2009/154556
PCT Pub. Date: Dec. 23, 2009

(65) Prior Publication Data
US 2011/0164385 A1 Jul. 7, 2011

(30) Foreign Application Priority Data

Jun. 20, 2008 (CN) .......................... 2008 1 0129214

(51) Int. Cl.
| | |
|---|---|
| *H05K 7/20* | (2006.01) |
| *B21D 53/02* | (2006.01) |
| *F28F 7/00* | (2006.01) |
| *F28F 3/14* | (2006.01) |

(52) U.S. Cl.
USPC ........ 361/699; 29/890.03; 165/80.4; 165/170

(58) Field of Classification Search .................. 165/170, 165/80.4; 361/688, 689, 699
See application file for complete search history.

(56) References Cited

U.S. PATENT DOCUMENTS 5,653,285 A 8/1997 Lee
5,704,419 A * 1/1998 Agonafer et al. ............. 165/121
(Continued)

FOREIGN PATENT DOCUMENTS

DE 4421025 A1 12/1995
EP 1175135 A1 1/2002
(Continued)

OTHER PUBLICATIONS

Supplementary European Search Report, dated Dec. 8, 2011, issued in connection with counterpart European Patent Application No. EP 09 76 6946.

(Continued)

*Primary Examiner* — Gregory Thompson
(74) *Attorney, Agent, or Firm* — Venable LLP; Eric J. Franklin

(57) ABSTRACT

A liquid cooler including a heat sink. A hollow body is produced by extrusion having at least one flat outer surface between a first and a second end. At least one elongated cavity passes through the body from the first to the second end. The hollow body includes a plurality of parallel fins directed into and along the at least one cavity. An insert housed in the at least one cavity connects the tops of the fins in a fluid-tight manner thereby forming liquid channels for a coolant liquid between the insert and the hollow body. A lid is attached at both ends of the hollow body for forming a liquid cooling system.

14 Claims, 3 Drawing Sheets

U.S. PATENT DOCUMENTS

| | | | |
|---|---|---|---|
| 6,330,157 B1* | 12/2001 | Bezama et al. | 361/704 |
| 7,002,795 B2* | 2/2006 | Trautman et al. | 361/695 |
| 7,044,198 B2* | 5/2006 | Matsushima et al. | 165/80.4 |
| 7,044,199 B2* | 5/2006 | Thayer et al. | 165/80.4 |
| 2005/0101718 A1* | 5/2005 | Lechtenboehmer | 524/492 |
| 2005/0199372 A1* | 9/2005 | Frazer et al. | 165/80.4 |
| 2006/0157225 A1* | 7/2006 | Martin et al. | 165/80.4 |

FOREIGN PATENT DOCUMENTS

| | | |
|---|---|---|
| EP | 1795852 A1 | 6/2007 |
| EP | 1925898 A1 | 5/2008 |
| JP | 08-179578 | 10/1996 |
| JP | 2002-170915 | 6/2002 |
| WO | WO-01/63666 A1 | 8/2001 |
| WO | WO-2005/088714 A1 | 9/2005 |

OTHER PUBLICATIONS

PCT/ISA/210—International Search Report—Oct. 21, 2009.

PCT/ISA/237—Written Opinion of the International Searching Authority—Oct. 21, 2009.

* cited by examiner

LIQUID COOLER AND METHOD OF ITS MANUFACTURE

CROSS-REFERENCE TO RELATED APPLICATIONS

This application claims priority to Chinese patent application 200810129214.3 filed 20 Jun. 2008 and is the national phase of PCT/SE2009/050748 filed 16 Jun. 2009.

BACKGROUND OF THE INVENTION

1. Technical Field

The present invention relates to a heat sink to be used in a liquid cooler, and a method of manufacturing the heat sink, a liquid cooler comprising the heat sink and the use of such a cooler.

2. Background Art

Electronic components are continuously improved. The sizes are reduced and the capacity increased. The ever increasing power density entails that also the cooling of such components needs to be improved.

In EP1175135, there is shown a heat sink in which four corrugated fins are respectively inserted into the four through holes and both ends of a casing are closed with covers by brazing. Forming and inserting the cooling fin adds labour and manufacturing cost.

Also in JP2002-170915 a liquid cooling heat sink in which an inner fin is inserted into the cooling liquid passages for promoting heat transfer of the flow passages is described. However, this construction gives a low heat conductivity, since the heat transfer has to take place via the brazing material, which has low heat conductivity and therefore it is impossible to obtain the low inner thermal resistance required.

In JP, 08-279578 channels are formed by producing a finned structure and closing off the upper openings of the cooling passages and arranging for a header at the end of the channels for the direction of the flow to be reversed. Nothing is said about the method for producing the fins and there is only one cooling channel section.

When extrusion is used to produce a heat sink, the internal cooling channel structure can be manufactured at a reasonable cost, since the number of machining steps can be minimized. There is however a limit to the height and the pitch of the fins which can be processed; therefore, it is difficult to maintain the cooling capacity of a liquid cooler comprising an extruded heat sink.

Thus, there is a need for improved cooling of electronic components. Principally a high cooling performance is desired, by means of which the temperature of electronic components can be kept at a low level. Furthermore, the cooling rate, with regard to the flow rate, is to be maximized. The design shall be simple and the manufacturing thereof must be cost-effective.

BRIEF SUMMARY OF THE INVENTION

One objective of the invention is to overcome the disadvantages of prior art. An effective and optimised cooling of electrical circuit components is provided. Said objective is obtained by means of the present liquid cooler having a cooling system of liquid channels, adapted to cool electronic components attached to a carrier in contact with the liquid cooler.

Accordingly, an object according to the present invention is to provide a liquid cooler with enhanced heat transfer having flow passages with improved heat removal capacity.

To accomplish the object mentioned above, according to a first embodiment of the present invention, there is provided a liquid cooler comprising a heat sink adapted to be thermally connected to a heat-generating component, wherein said heat sink comprises an extruded body comprising at least one elongated cavity passing through the body for forming a hollow body. Said hollow body is provided with a plural number of internal fins directed into and along the cavity. Lids are adapted to be attached to both ends of said extruded body. The fins may be provided on both an upper and a lower inner surface facing the cavity of the liquid cooler or on only one of the surfaces. The fins may as an alternative be arranged as radi of a circle.

According to a second embodiment said liquid cooler further includes a cooling arrangement that comprises an inlet conduit, an outlet conduit, a cooling liquid pump and a plurality of liquid channels being used as supply and return channels for the cooling liquid.

The pump is connected to and arranged between the outlet conduit and the inlet conduit. The liquid channels are connected in parallel or in series with each other and with the inlet and outlet conduit, whereby the inlet and outlet of the liquid channels can be located on the same end of the heat sink or different ends of the heat sink. The inlet and outlet conduits may have any shape, but are preferably circular and of a smaller diameter than the total area of the channels formed in one cavity, making the heat sink adapted to be attached to an external liquid conduit.

A structure with a channel pitch of less than approximately 2 mm cannot be produced by extrusion and milling has to be used, which is time consuming and uneconomical. When the structure is produced as a hollow extruded body having centre cavities as indicated, the channels can be produced with the minimum pitch and maximum height at both the upper and lower part of the cooler, which provides for a better cooling capacity when heat sources are attached to two flat outer surfaces the heat sink. An insert is introduced into the cavity to form the systems of liquid channels. Said insert may be flat having an upper and a lower surface and abutting the top of the fins after insertion into the cavity. As an alternative the insert may have a circular cross section and thereby abutting the top of the fins after insertion in a cavity wherein the fins are arranged as radi of a circle.

The use of channel systems separated by internal walls formed by said fins of the hollow body on the upper and/or lower side of the insert also improves the capacity to withstand high pressures. With a single channel structure comprising a corresponding volume of liquid the walls of the channels will not be able to withstand the pressure created.

In this way a liquid cooler is produced on which the electrical circuit components can be directly mounted or on which a board comprising the electrical components may be arranged.

DETAILED DESCRIPTION

Hereinafter, embodiments according to the present invention will be fully explained, by referring to the attached drawings.

Figure 1:
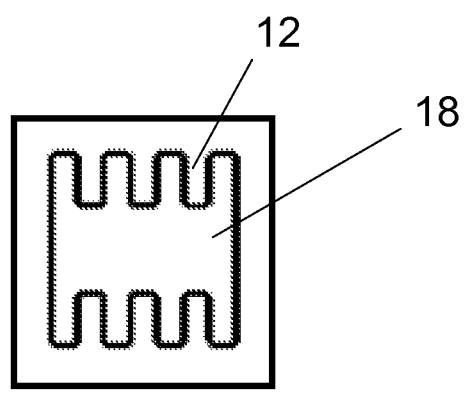
FIG. 1 is a cross sectional view of the extruded heat sink hollow body.
Figure 2:
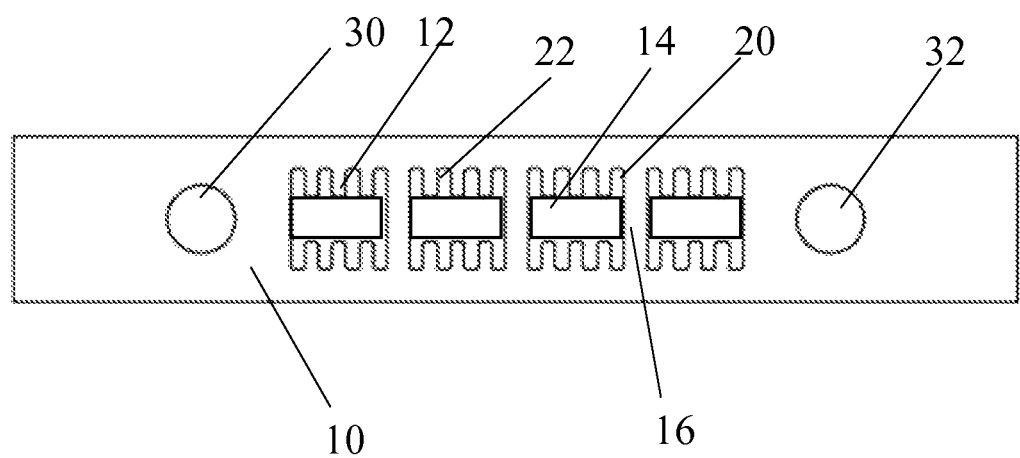
FIG. 2 is a cross section of a preferred embodiment of the heat sink according to the present invention.
Figure 3:
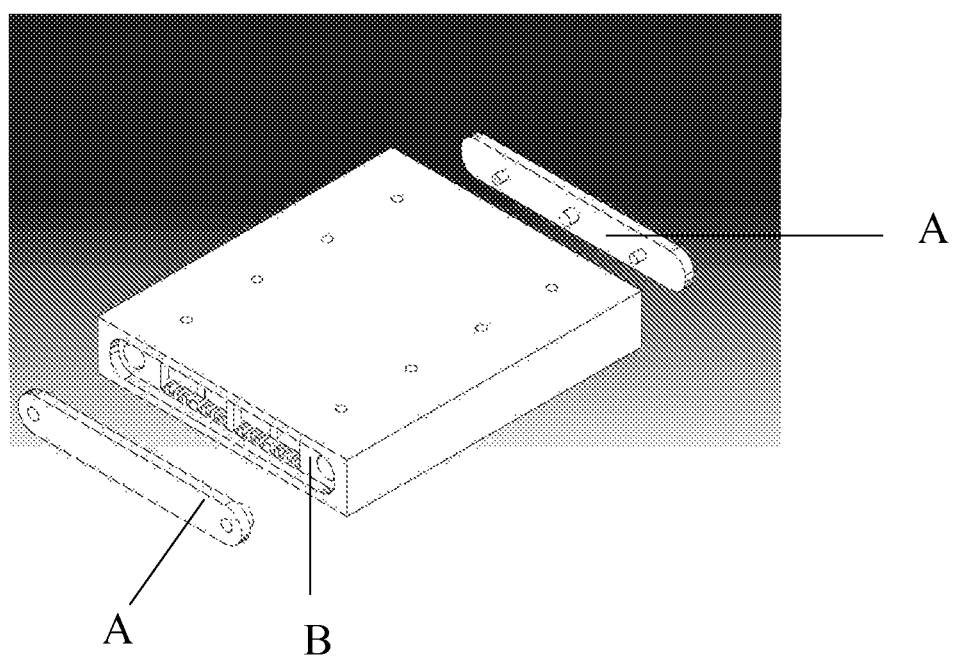
FIG. 3 is a three dimensional view of an embodiment of the liquid cooler.

According to a first embodiment, a heat sink is formed by extruding an aluminum billet through a die, to form a hollow body (10) comprising at least one cavity passing through the hollow body, comprising a plurality of supply passages, and having a lid attached to each end of the heat sink. The number of conduits is not limited and may be any suitable number. An even number of conduit leads to the exit of the liquid beeing on the same end of the heat sink as the inlet for the liquid.

According to a preferred embodiment of the invention the heat sink comprises an inlet conduit (30) and an outlet conduit (32) for the cooling liquid and a plurality of liquid channels serving as supply (20) and return (22) passages for the liquid. The inlet and outlet conduit (30, 32) may be of circular cross section or may have any other shape. Preferably the inlet and outlet conduits are of a different shape than the other conduits.

The liquid channels serving as said supply and return passages (20,22) are formed by creating during extrusion at least two internal cavities provided with a plurality of internal fins (12) directed into and along the cavities respectively. The fins 12 extends the cooling surface and gives a more efficient cooling than would a single passage having the same cross sectional area.

The channels (20, 22) formed in one cavity (18) are separated from the channels (20, 22) formed in a neighbouring cavity (18) by dividing walls (16), whereby a serpentine cooling system of the channels formed in the cavities is accomplished. The formation of the channels (20, 22) of a cavity (18) is established by an insert (14) being introduced into the central part of the cavity along its extension, whereby the tops of the fins (12) are blocked in a fluid-tight manner and said channels (20, 22) for the liquid is formed between the insert (14) and the hollow body (10). The fins (12) form internal walls of the liquid channels.

A recess (B) is formed by milling at the end of the extruded hollow body at both of its ends, for fitting the lids (A) in. The depth of the recess preferably corresponds to the thickness of the lid. Every second dividing wall (16) at each end of the hollow body (10) is likewise milled to form return passageways for the liquid from the supply to the return passages and from the inlet and outlet conduits to the supply and return passages, so as to follow a serpentine path.

A heat sink is then finalized by the lids (A) being finally welded on each end of the hollow extruded body (10) to form a cooling system of liquid channels, where the liquid arranged to flow in a set of channels forming supply passages (20) of a first cavity is deflected into a set of channels forming return passages (22) at the end of said first cavity. When connecting the cavities (18) in parallel, whereby all liquid channels serve as supply channels, all the dividing walls (16) at the same end of the hollow body are milled and a space is formed under the lid, in which space the liquid from all the liquid channels (20) are collected before being transported through a hole in the lid (A) to an external liquid conduit system.

Any welding method may be used, but Friction Stir Welding (FSW) using a rotating pin is preferably used to attach the lids to the hollow body, by welding along the lid contour. FSW gives a more reliable joint then gas or resistance welding so that higher pressures may be used for the cooling liquid. The contact resistance of the joint is also very low compared to brazing methods, which adds to the cooling capacity of the heat sink.

The liquid enters through a hole in the lid into the inlet conduit (30) and turns into the liquid channels (20, 22) and passes through the heat sink in a serpentine way until the exit through another hole in the lid (or the other lid) serving as the outlet conduit (32) and is then circulated through an external conduit via the pump (not shown) and returned into the heat sink. Said serpentine way of flow for the liquid coolant is achieved by introducing the coolant from the inlet conduit (30) into the channels (20) of a first cavity (18). The coolant is then flowing from the first end to the second end of the heat sink. Herein channels providing flow in this direction are called supply channels (20). At the end of the supply channels, i.e. the downstream end of the supply channels (20), the flow of coolant is deflected by means of a return passway into a the channels of a second cavity (18). Herein channels providing flow from the second end to the first end of the heat sink are referred to as return channels (22). At the end of the return channels, i.e. the downstream end of the return channels (22), the flow of coolant is deflected by means of a passway into a third cavity (18). Said third cavity (18) contains supply channels (20) and the process described is repeated until the coolant is let out through the outlet conduit (32) located at either the first end or the second end of the heat sink. Thus passways are thus arranged in the heat sink such that the downstream ends of the supply channels (22) of a cavity (18) connect the upstream ends of the return channels (22) of a consecutive cavity. Correspondingly, passways are connecting the downstream ends of the return channels (22) of a cavity (18) with the upstream ends of supply channels (20) of a consecutive cavity (18).

The cooling liquid used could be any suitable coolant, such as water or a mixture of water/anti-freeze liquid.

Both upper and lower outer surfaces of the liquid cooler 10 may be connected thermally with a mounting surface of a semiconductor module by soldering or electronic components may be directly attached to the liquid cooler.

A flat extruded heat sink entails simple and cost-effective design. Aluminum is a material of high thermal conductivity, which is beneficial. Furthermore, the heat radiation efficiency of the heat sink is improved by the increased contact surface area between the coolant and the heat sink body when a plurality of liquid channels are used.

The means for connecting the set of liquid channels formed inside the at least one cavity to an external conduit may be any suitable coupling, or if lids are attached these can comprise the suitable means.

By means of for example manifolds, which are attached to the heat sink, an extruded heat sink can be put to use. The manifolds can be designed in accordance with prevailing circumstances, while the heat sink can be advantageously mass produced.

Consequently, the present invention provides;
A heat sink comprising:
- a hollow body (10), produced by extrusion, having at least one flat outer surface between a first and a second end and said body (10) comprising at least one elongated cavity (18) passing through the body (10) from the first to the second end,
- said hollow body (10) including a plurality of parallel fins (12) directed into and along said at least one cavity (18),
- an insert (14) housed in said at least one cavity (18) connecting the tops of the fins (12) in a fluid-tight manner thereby forming liquid channels (20, 22) for a coolant liquid between the insert (14) and the hollow body (10),
- a lid (A) attached at both ends of the hollow body (10) for forming a liquid cooling system.

According to a preferred embodiment the present invention provides;
An extruded heat sink, comprising:
- at least one first cavity (18) comprising a plurality of supply channels (20) for a cooling liquid, and at least one second cavity (18) comprising a plurality of return channels (22) for the cooling liquid, which supply and return channels (20, 22) are connected in series with each other by means of passways arranged in the heat sink such that the downstream ends of the supply channels (20) of a first cavity (18) connect the upstream ends of the return channels (22) of a consecutive second cavity (18) and correspondingly passways connect the downstream ends of the return channels (22) of a second cavity (18) with the upstream ends of supply channels (20) of a consecutive first cavity (18).

It further provides;

A method of producing an flat extruded aluminum heat sink (10), characterized by the steps a) extruding a hollow part (10) to form at least one internal conduit, the at least one internal conduit comprising a plurality of internal fins (12) forming a staggered surface on the internal conduit b) inserting an insert (14) into each of the at least one internal conduits to form on at least one side of the insert a plurality of supply and return channels (20,22)

c) closing both ends of said hollow part (10) with a pair of lids (A) to form a heat sink with an internal liquid supply system.

The invention claimed is:

1. A heat sink, comprising:
   a hollow body, produced by extrusion, having at least one flat outer surface between a first end and a second end, said body comprising at least one elongated cavity passing through the body from the first end to the second end, said hollow body including a plurality of parallel fins directed into and along said at least one cavity,
   an insert housed in said at least one cavity connecting tops of the fins in a fluid-tight manner thereby forming liquid channels for a coolant liquid between the insert and the hollow body, and
   a lid attached at each of the first end and the second end of the hollow body for forming a liquid cooling system.

2. The extruded heat sink according to claim 1, wherein the heat sink comprises a plurality of cavities, and wherein the cavities are connected in parallel.

3. The extruded heat sink according to claim 1, wherein the heat sink comprises a plurality of cavities, and wherein the cavities are connected in series.

4. The extruded heat sink according to claim 3, wherein the heat sink comprises a plurality of cavities, wherein at least one first cavity comprises a plurality of supply channels for a cooling liquid, and wherein at least one second cavity comprises a plurality of return channels for the cooling liquid, wherein the supply channels and the return channels are connected in series with each other by passways arranged in the heat sink such that downstream ends of the supply channels of a first cavity connect upstream ends of the return channels of a consecutive second cavity and correspondingly passways connect downstream ends of the return channels of a second cavity with upstream ends of supply channels of a consecutive first cavity.

5. The extruded heat sink according to claim 1, wherein the insert is flat with an upper side and a lower side, said upper and lower side of the insert connecting the tops of the fins thus establishing liquid channels on both the upper side and lower side of the insert.

6. The extruded heat sink according to claim 1, further comprising:
   an inlet conduit and an outlet conduit adapted to be connected to an external liquid conduit.

7. The extruded heat sink according to claim 1, wherein the hollow body is extruded from an aluminum or an aluminum alloy billet.

8. A liquid cooler, comprising:
   a flat extruded heat sink comprising a hollow body, produced by extrusion, having at least one flat outer surface between a first end and a second end, said body comprising at least one elongated cavity passing through the body from the first end to the second end, said hollow body including a plurality of parallel fins directed into and along said at least one cavity, an insert housed in said at least one cavity connecting tops of the fins in a fluid-tight manner thereby forming liquid channels for a coolant liquid between the insert and the hollow body, a lid attached at each of the first end and the second end of the hollow body for forming a liquid cooling system, and an inlet conduit and an outlet conduit adapted to be connected to an external liquid conduit, and
   a cooling liquid pump connected to and arranged between the outlet conduit and the inlet conduit.

9. A method of producing a heat sink, the method comprising:
   extruding a billet of aluminum, or an aluminum alloy, to form a hollow body containing at least one elongated internal cavity passing through the body from a first end to a second end, and the walls of said at least one cavity including a plurality of parallel fins directed into and along said at least one cavity;
   inserting an insert into the at least one internal cavity connecting said fins in a fluid-tight manner thereby forming liquid channels for a coolant liquid between the insert and the hollow body; and
   closing both ends of said hollow part with a pair of lids to form a heat sink with an internal liquid cooling system.

10. The method according to claim 9, wherein the hollow body comprises a plurality of cavities, the method further comprising:
    milling in at least one end of said hollow body to remove a part of a wall between neighboring cavities of said hollow body to form a passway for said coolant liquid from liquid channels of a first cavity to said liquid channels of a second cavity.

11. The method according to claim 9, further comprising:
    milling to remove at both ends a part of the hollow body to form a recess for fitting the lids in.

12. The method according to claim 9, wherein the lids are attached by friction stir welding.

13. The method according to claim 9, wherein the method cools electrical components.

14. The liquid cooler according to claim 8, wherein the cooler cools electrical components.

* * * * *

UNITED STATES PATENT AND TRADEMARK OFFICE
CERTIFICATE OF CORRECTION

Page 1 of 1

PATENT NO.         : 8,441,794 B2
APPLICATION NO.    : 13/000176
DATED              : May 14, 2013
INVENTOR(S)        : Hou et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 129 days.

Signed and Sealed this
Second Day of December, 2014

Michelle K. Lee
*Deputy Director of the United States Patent and Trademark Office*